United States Patent [19]

Yoneda

[11] Patent Number: 4,929,990
[45] Date of Patent: * May 29, 1990

[54] SEMICONDUCTOR MEMORY DEVICE

[75] Inventor: Masahiro Yoneda, Hyogo, Japan

[73] Assignee: Mitsubishi Denki Kabushiki Kaisha, Tokyo, Japan

[ * ] Notice: The portion of the term of this patent subsequent to Dec. 12, 2006 has been disclaimed.

[21] Appl. No.: 213,492

[22] Filed: Jun. 30, 1988

[30] Foreign Application Priority Data

Jul. 1, 1987 [JP] Japan .................. 62-164409

[51] Int. Cl.⁵ .................. H01L 27/04; G11C 11/40
[52] U.S. Cl. .................. 357/23.6; 357/45
[58] Field of Search .................. 357/23.6, 55, 45

[56] References Cited

U.S. PATENT DOCUMENTS

| | | | |
|---|---|---|---|
| 4,651,183 | 3/1987 | Lange et al. | 357/23.6 |
| 4,673,962 | 6/1987 | Chatterjee et al. | 357/23.6 |
| 4,751,557 | 6/1988 | Sunami et al. | 357/23.6 |
| 4,763,178 | 8/1988 | Sakui et al. | 357/23.6 |

FOREIGN PATENT DOCUMENTS 0169332 1/1986 European Pat. Off. .
3525418 1/1988 Fed. Rep. of Germany .
3730095 3/1988 Fed. Rep. of Germany .

OTHER PUBLICATIONS

IBM Technical Disclosure Bulletin, vol. 28, No. 8, Jan. 1986, pp. 3385, 3386.

*Primary Examiner*—William D. Larkins
*Attorney, Agent, or Firm*—Lowe, Price, LeBlanc, Becker & Shur

[57] ABSTRACT

A semiconductor memory device comprises a semiconductor substrate, four memory cells arranged in point symmetry on the main surface, each of the memory cells having one transistor (6) formed around the point of symmetry and one capacitor adjacent to the outside of the transistor (6), the capacitor having a surface capacitor region (4a) parallel to the main surface and a trench capacitor region (40a) parallel to a side wall of a trench (40) formed in the main surface along the outer periphery of the surface capacitor region (4a), and an insulating layer (10) covering the memory cells and having one contact hole (2) arranged at the center of the point symmetry, with the contact hole (2) enabling electrical contact to each transistor (6).

8 Claims, 3 Drawing Sheets

SEMICONDUCTOR MEMORY DEVICE

CROSS-REFERENCE TO RELATED, COPENDING APPLICATION

Related, copending application of particular interest to the instant application is U.S. Ser. No. 094,647, entitled "Dynamic-Type Semiconductor Memory Device", filed Sept. 9, 1987 assigned to the same assignee of the instant application.

BACKGROUND OF THE INVENTION

1. Field of the Invention

The present invention relates to a semiconductor memory device and, more specifically, it relates to improvements in the arrangement of the memory cells, in the electrical connection structure and in the structure of the capacitor region.

2. Description of the Prior Art

A semiconductor memory device comprises capacitors in which information is stored, transistors which are switched by corresponding word lines for inputting (writing) and outputting (reading) information to and from the corresponding capacitors, and bit lines connected to the transistors for transmitting the information.

FIG. 4A shows a schematic plan view of a conventional dynamic type semiconductor memory device. FIG. 4B is a cross sectional view taken along a line B—B of FIG. 4A. In these figures, a source region 6a and drain regions 6b of transistors 6 are formed on a main surface of a silicon substrate 1 and capacitor regions 4a are provided adjacent to the drain regions 6b. These regions are surrounded by an isolating region 7 and a channel cut 8 is formed below the isolating region 7. Over channel regions 3a provided between the source region 6a and the drain regions 6b, word lines 3 are formed with corresponding gate insulating films 3b interposed therebetween. A capacitor electrode 9 is formed over the capacitor regions 4a with a capacitor insulating film 4b interposed therebetween. The area on which the capacitor electrode 9 is formed is shown by the hatching of broken lines in FIG. 4A. These word lines 3 and the capacitor electrode 9 are covered with an insulating layer 10. A bit line 5 formed on the insulating layer 10 is connected through a contact hole 2 to the source region 6a which is common to the two transistors 6. Namely, two capacitors 4a are connected to one bit line 5 via one contact hole 2 through respective switching transistors 6.

As can be seen from FIG. 4A, a contact hole 2 formed on a source region 6a of another memory connected to the adjacent bit line 5 exist in the vicinity of the outer periphery of one capacitor region 4a. Therefore, if a trench is formed around the capacitor region 4a so as to employ the side wall of the trench also as a capacitor region, the capacitor region on the side wall of the trench is close to and opposed to the transistor region of the adjacent member cell, affecting the characteristics of the transistors.

SUMMARY OF THE INVENTION

In view of the foregoing, an object of the present invention is to provide a semiconductor memory device which is improved in the arrangement of the memory cells, in electrical connection structure and in the structure of the capacitor region.

A semiconductor memory device in accordance with the present invention comprises: a semiconductor substrate having a main surface; and four memory cells arranged in point symmetry on the main surface, each of the memory cells comprising one transistor having a source region formed around the point of symmetry and a drain region formed therearound, and one capacitor adjacent to the outside of the drain region, the capacitor comprising a surface capacitor region parallel to the main surface of the substrate and a trench capacitor region parallel to a side wall of a trench formed in the main surface of the substrate along the outer periphery of the surface capacitor region, and the the semiconductor memory device further comprises an insulating layer covering the memory cells and having one contact hole arranged on the center of the point symmetry, with the contact hole enabling electrical connection to the source region of each transistor.

In the semiconductor memory device in accordance with the present invention, transistors arranged in point symmetry around one contact hole are surrounded by respective capacitors formed adjacent to the outside thereof. Therefore, the trench capacitor region of each capacitor is not opposed to the transistor region in the vicinity, whereby a highly integrated semiconductor memory device of high performance can be provided without affecting the characteristics of the transistors.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
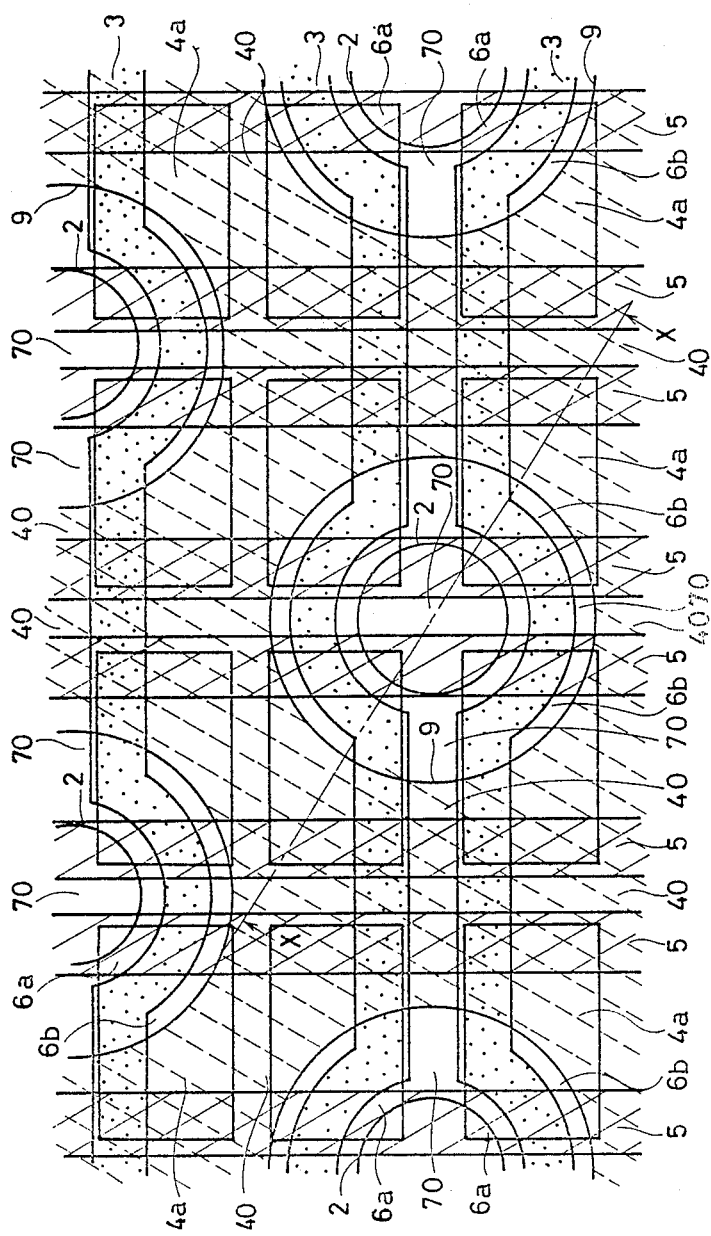
FIG. 1 is a schematic plan view of a semiconductor memory device in accordance with one embodiment of the present invention.
Figure 2:
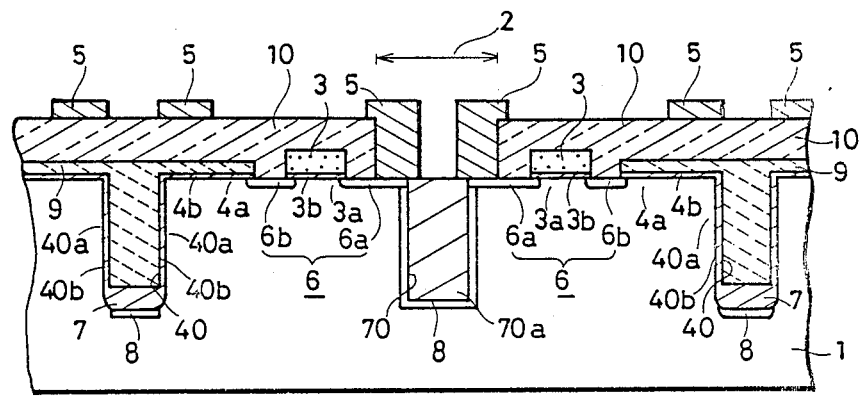
FIG. 2 is a schematic cross sectional view taken along the line X—X of FIG. 1.

FIG. 1 shows a schematic plan view of a dynamic type semiconductor memory device in accordance with one embodiment of the present invention. FIG. 2 is a schematic cross sectional view taken along a line X—X of FIG. 1. In these figures, source regions 6a and drain regions 6b of transistors are formed on a main surface of a semiconductor substrate 1 and surface capacitor regions 4a parallel to the main surface of the substrate 1 are formed adjacent to the drain regions 6b. Trenches 40 are formed around the surface capacitor regions 4a, the side wall of a trench 40 being used as a trench capacitor region 40a continuous to the surface capacitor region 4a. Over a channel region 3a between the source region 6a and the drain region 6b, a word line 3 is formed with a gate insulating film 3b interposed therebetween. The surface capacitor region 4a and the trench capacitor region 40a are opposed to the capacitor electrode 9 through the capacitor insulating films 4b and 40b, respectively. The areas on which the capacitor electrodes 9 are formed are shown by the hatching of broken lines in FIG. 1. More specifically, under the region of the capacitor electrode 9 shown by the hatching of broken lines in FIG. 1, the outer periphery of the surface capacitor region 4a is surrounded by the capacitor trench 40. The word lines 3 and the capacitor electrode 9 are covered with an insulating layer 10. A pair of bit lines 5 formed on the insulating layer 10 are connected to the source regions 6a through a contact hole 2. Four transistors 6 arranged in point symmetry around the contact hole 2 are isolated from each other by isolating trenches 70. The isolating trench 70 may be filled with an insulating material 70a. The capacitors of the memory cells are isolated from each other by the isolating regions 7 formed at the bottom portions of the capacitor trenches 40. As is apparent from FIG. 1, the isolating trenches 70 and the capacitor trenches 40 can be simultaneously formed. Channel cuts 8 are formed below these isolating regions 70 and 7. It would be understood that the source regions 6a of two transistors which are connected to the same bit line 5 are not necessarily be isolated from each other in the contact hole 2.

As described above, in a semiconductor memory device in which four memory cells are arranged in point symmetry around one contact hole 2, capacitors can be always arranged on both sides of one capacitor trench 40. Namely, the problem as in the conventional device, in which is one side of the capacitor trench is placed adjacent to the transistor region thereby affecting the characteristics of the transistor, can be eliminated. Therefore, a highly integrated semiconductor memory device of high performance can be provided without degrading the characteristic of the memory cells.

Figure 3:
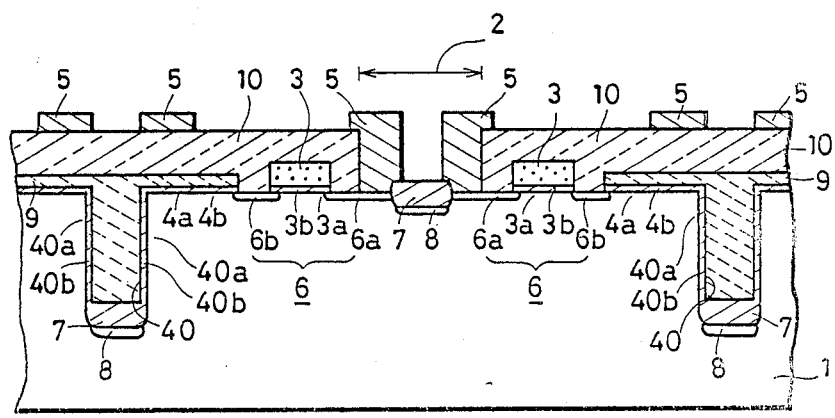
FIG. 3 is a cross sectional view similar to FIG. 2 showing another embodiment with some portions changed.
Figure 4A:
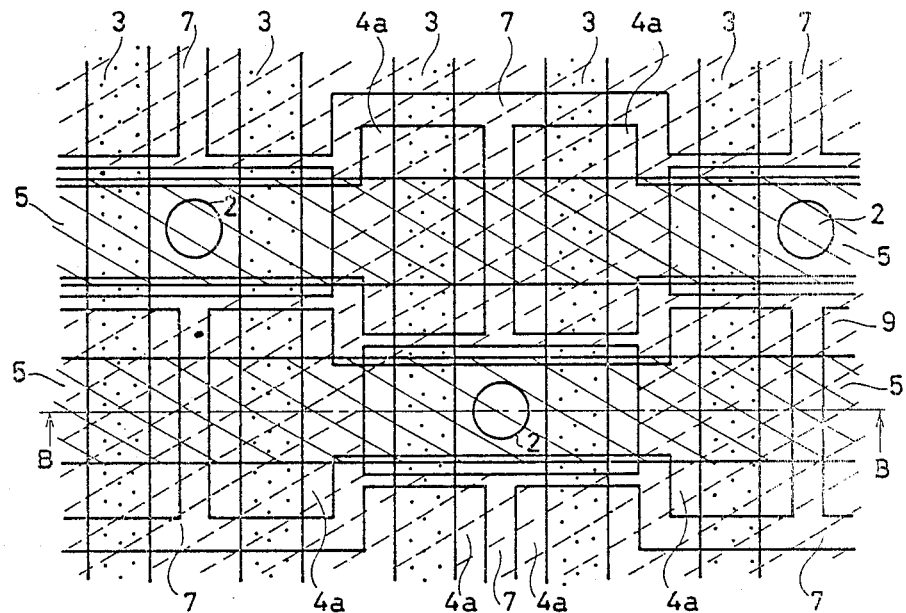
FIG. 4A is a schematic plan view of a conventional semiconductor memory device.
Figure 4B:
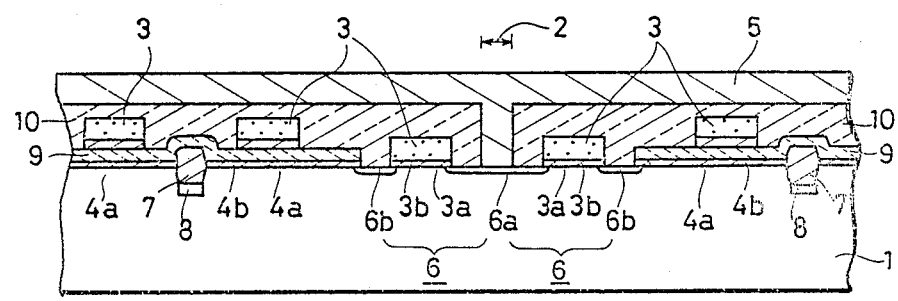
FIG. 4B is a cross sectional view taken along the line B—B of FIG. 4A.

FIG. 3 is a cross sectional view similar to FIG. 2, showing another embodiment with some portions changed. In this embodiment, four transistors arranged in point symmetry around the contact hole 2 are isolated from each other by isolating oxide films 7 formed by selective oxidation and the like and by the channel cuts 8 therebelow, instead of the isolating trenches 70. In this case, the trench 40 in the capacitor electrode region 9 shown by the hatching of the broken lines in FIG. 1 comes to an end at the border of four transistor regions surrounded by a circle around the contact hole 2.

As described above, according to the present invention, four memory cells are structured by forming capacitors outside four transistors arranged in point symmetry with the capacitors connected to respective transistors, so that even if a trench capacitor region is provided around the surface region of each capacitor, the transistor region do not opposed close to the trench capacitor region. Therefore, a highly integrated semiconductor memory device of high performance can be provided without affecting the characteristics of the transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic-type semiconductor memory device, comprising:
    a semiconductor substrate (1) having a main surface;
    a plurality of word lines formed on said substrate;
    a plurality of bit lines intersecting with said plurality of word lines;
    a plurality of memory cells provided in correspondence with intersections of said word lines and said bit lines, each of said memory cells being included within a memory cell group formed of four adjacent memory cells arranged symmetrically about a common contact hole, each memory cell having a transistor (6) including a source region (6a) formed around the common contact hole and a drain region (6b) formed radially outside of said source region (6a) with respect to said contact hole and a capacitor formed adjacent to an outer edge of said drain region (6b) with respect to said contact hole, said capacitor having a surface capacitor region (4a) parallel to said main surface and a trench capacitor region (40a) parallel to a side wall of a trench (40) formed in said main surface around an outer periphery of said capacitor region (4a);
    a first electrical connection formed between two of said transistors and a common one of said bit lines through said common contact hole;
    a second electrical connection formed between the remaining two of said transistors and another common one of said bit lines through said common contact hole;
    a third electrical connection formed between two of said transistors which are respectively connected to different bit lines by said first electrical connection and a common one of said word lines; and
    a fourth electrical connection formed between another remaining two of said transistors and another common one of said word lines,
    whereby four memory cells included within a said memory cell group are controlled by only two said bit lines and two said word lines.

2. A dynamic-type semiconductor memory as recited in claim 1 wherein
    each memory cell is formed as a memory cell forming region having a shape having a radial dimension which is substantially equal to the chord of an arc subtended by said memory cell forming region about said point in a top plan view.

3. A dynamic-type semiconductor memory device in accordance with claim 1, wherein
    each of said source/drain regions of the transistors of each memory cell has a circular arc-shaped boundary about the symmetry point of the cell group where the memory cell exists, each word line has a circular arc-shaped portion at the vicinity of the symmetry point of the cell group so as to run along each of said source/drain regions, and an arc portion forms the gate electrode of the transistor.

4. A dynamic-type semiconductor memory as recited in claim 1 wherein
    said plurality of word lines includes a pair of word lines arranged adjacent said contact hole and said plurality of bit lines includes a pair of bit lines arranged adjacent said contact hole and said pair of word lines and said pair of bit lines surround said contact hole about which said memory cells in a cell group are symmetrically arranged.

5. A dynamic-type semiconductor memory device comprising memory cell arrays comprising m by n memory cells arranged in a matrix with m rows and n columns,
    m by n memory cells being divided into (m×n)/4 cell groups, each cell group comprising four adjacent memory cells positioned symmetrically about a point, each memory cell comprising one storage means and one transistor arranged adjacent the symmetry point, said transistor having a source and a drain region formed around and separated from said source region, said storage means having one electrode formed through an insulator on a side wall of a trench formed in a surface of a semiconductor substrate around the outer periphery of said drain region of said transistor, further comprising:

n/2 word line groups, each including a pair of word lines, arranged in each column, each word line of said pair connected to one-half of the gate electrodes of the transistors of the memory cells arranged in a respective column, and m/2 bit line groups, each including a pair of bit lines, arranged in each row, each bit line of said pair connected to one-half of the source/drain regions of the transistors of the memory cells arranged in a respective row, at the vicinity of the symmetry points of said cell groups.

6. A dynamic-type semiconductor memory as recited in claim 5 wherein each memory cell is formed as a memory cell forming region having a shape having a radial dimension which is substantially equal to the chord of an arc subtended by said memory cell forming region about said point in a top plan view.

7. A dynamic-type semiconductor memory device in accordance with claim 5, wherein each of said source/drain regions of the transistors of each memory cell has a circular arc-shaped boundary about the symmetry point of the cell group where the memory cell exists, each word line has a circular arc-shaped portion at the vicinity of the symmetry point of the cell group so as to run along each of said source/drain regions, and an arc portion forms the gate electrode of the transistor.

8. A dynamic-type semiconductor memory as recited in claim 5 wherein at least one said group of word lines include a pair of word lines arranged adjacent said point and at least one said group of bit lines include a pair of bit lines arranged adjacent said point and said pair of word lines and said pair of bit lines surround said point about which said memory cells in a cell group are symmetrically arranged.

* * * * *